US007351630B2

(12) United States Patent
Jung

(10) Patent No.: US 7,351,630 B2
(45) Date of Patent: Apr. 1, 2008

(54) METHOD OF MANUFACTURING FLASH MEMORY DEVICE

(75) Inventor: Woo Yung Jung, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 151 days.

(21) Appl. No.: 11/454,233

(22) Filed: Jun. 16, 2006

(65) Prior Publication Data

US 2007/0117302 A1 May 24, 2007

(30) Foreign Application Priority Data

Nov. 23, 2005 (KR) ............... 10-2005-0112134

(51) Int. Cl.
 *H01L 21/8238* (2006.01)
(52) U.S. Cl. ............... 438/211; 438/233; 438/257; 438/201; 438/241; 438/624; 257/E21.613; 257/E21.682; 257/E21.691
(58) Field of Classification Search ............... 438/211, 438/233, 201, 257, 241, 624; 257/E21.613, 257/E21.682, E21.691
See application file for complete search history.

(56) References Cited

U.S. PATENT DOCUMENTS 6,936,885 B2 * 8/2005 Shin et al. ............... 257/315

2006/0245245 A1 * 11/2006 Mokhlesi et al. ...... 365/185.01

FOREIGN PATENT DOCUMENTS

KR 1020070002464 A 1/2007
KR 1020070005074 A 1/2007

* cited by examiner

*Primary Examiner*—George Fourson
*Assistant Examiner*—Julio J Maldonado
(74) *Attorney, Agent, or Firm*—Marshall, Gerstein & Borun LLP

(57) ABSTRACT

A method of manufacturing a flash memory device, including the steps of forming a gate on a semiconductor substrate in which a cell region, a source selection line region, and a drain selection line region are defined and then forming spacers on sidewalls of the gate; depositing a nitride film and a first interlayer insulating film on the entire structure, etching a region of the first interlayer insulating film to form a source contact hole, forming a conductive film on the entire structure to bury the source contact hole, and polishing the conductive film; forming a second interlayer insulating film on the entire structure, and then etching the second and first interlayer insulating films and the nitride film using a mask through which regions in which a cell region and a drain contact will be formed are opened; and, forming a polysilicon layer on the entire structure.

3 Claims, 2 Drawing Sheets

METHOD OF MANUFACTURING FLASH MEMORY DEVICE

BACKGROUND

1. Field of the Invention

The invention generally relates to a method of manufacturing a memory device and, more particularly, to a method of manufacturing a flash memory device, in which it can minimize an inter-gate interference phenomenon.

2. Discussion of Related Art

A multi-level cell (MLC) is a flash memory cell used to store 2-bit data in one memory cell in order to increase the level of integration. In the MLC, one cell can be divided into four level states. Accordingly, the bit number of the MLC is twice greater than that of a single level cell (SLC) used to store 1-bit data in one memory cell.

In the MLC, however, cell uniformity becomes irregular since the cell threshold voltage (Vt) varies. This results in an interference phenomenon generated by the capacitance between the cells.

It is therefore necessary to reduce the shift in the cell threshold voltage (Vt). However, as the level of integration of devices increases, spaces at which a unit active region and a unit field region will be formed become more narrow. This makes the interference phenomenon more problematic since the inter-gate distance becomes smaller.

SUMMARY OF THE INVENTION

In one embodiment, the invention provides a method of manufacturing a flash memory device, which method can reduce the inter-gate interference phenomenon by reducing the capacitance between the gates.

Accordingly, one an embodiment of the invention provides a method of manufacturing a flash memory device, including the steps of forming a gate on a semiconductor substrate in which a cell region, a source selection line region, and a drain selection line region are defined and then forming spacers on sidewalls of the gate; depositing a nitride film and a first interlayer insulating film on the entire structure, etching a region of the first interlayer insulating film to form a source contact hole, forming a conductive film on the entire structure to bury the source contact hole, and polishing the conductive film; forming a second interlayer insulating film on the entire structure, and then etching the second and first interlayer insulating films and the nitride film using a mask through which regions in which a cell region and a drain contact will be formed are opened; and, forming a polysilicon layer on the entire structure.

BRIEF DESCRIPTION OF THE DRAWINGS

A more compete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF EMBODIMENTS

The invention will be described in detail in connection with certain exemplary embodiments with reference to the accompanying drawings.

FIGS. 1A to 1D are cross-sectional view illustrating a method of manufacturing a flash memory device according to an embodiment of the invention.

Figure 1A:
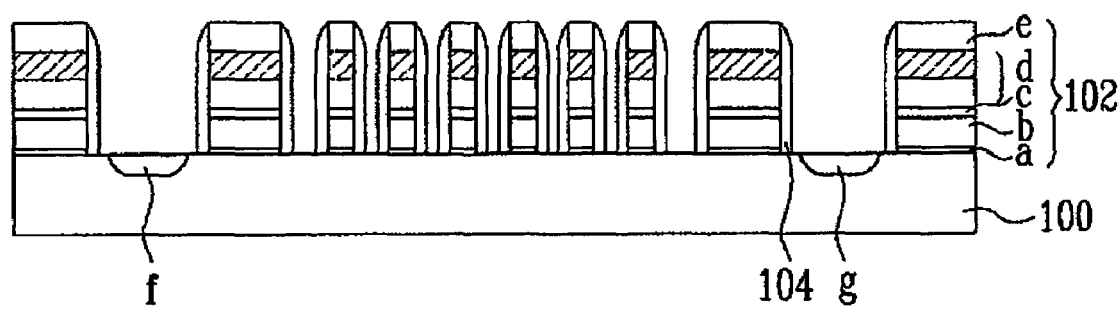
FIGS. 1A to 1D are cross-sectional view illustrating a method of manufacturing a flash memory device according to an embodiment of the invention.

Referring to FIG. 1A, a gate 102 in which a tunnel oxide film A, a floating gate B, a dielectric layer C, a control gate D made of a polysilicon layer and a conductive (e.g., tungsten) film, and a hard mask film E are laminated is formed on a semiconductor substrate 100 in which a cell region, a source selection line region, and a drain selection line region are defined. Spacers 104 are formed on the sidewalls of the gate 102. The spacers 104 may preferably be formed using an oxide film.

Figure 1B:
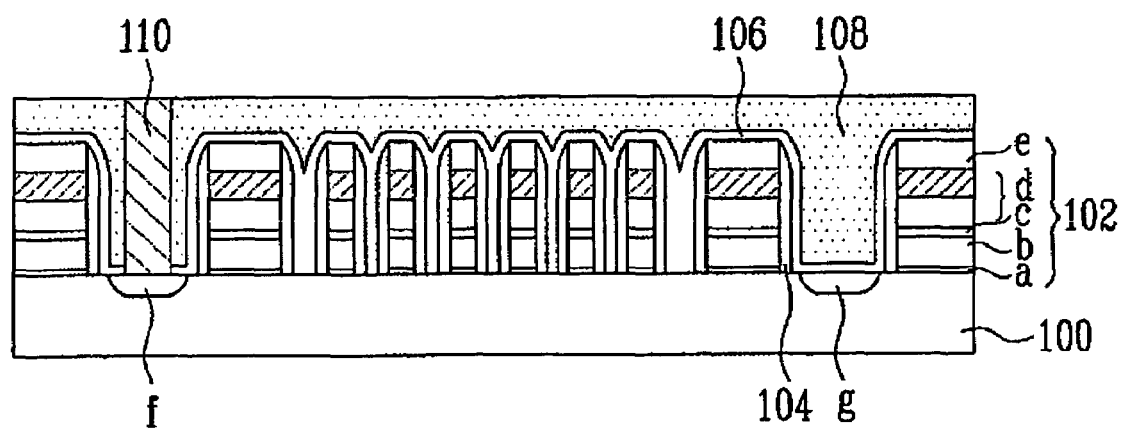

Referring to FIG. 1B, a nitride film 106 and a first interlayer insulating film 108 are deposited on the entire structure. The first interlayer insulating film 108 is polished. A region of the first interlayer insulating film 108 is etched preferably by photolithography and etch processes employing a mask, thereby forming a contact hole through which a source F is exposed.

A tungsten film is then formed on the entire structure. The tungsten film is polished until a top surface of the first interlayer insulating film 108 is exposed, thereby forming a source contact 110.

Figure 1C:
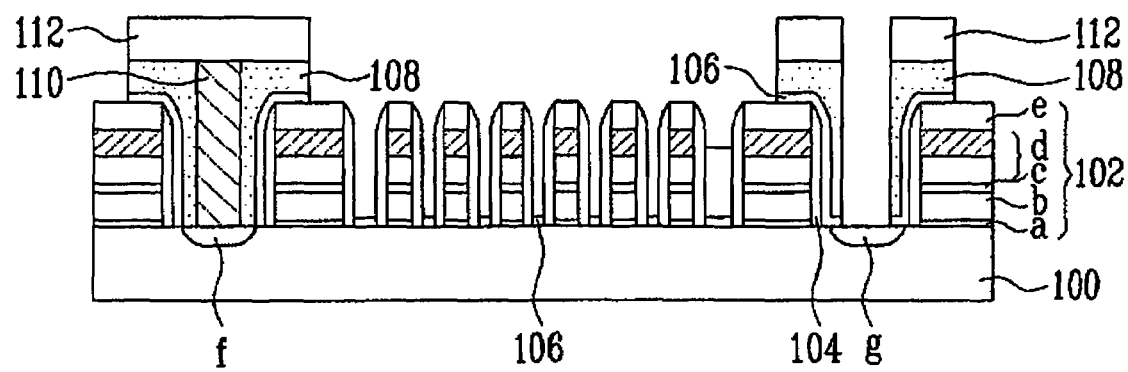

Referring to FIG. 1C, a second interlayer insulating film 112 is formed on the entire structure. The second and first interlayer insulating films 112 and 108, and the nitride film 106 are etched by photolithography and etch processes employing a mask, so that regions in which a cell region and a drain contact will be formed are exposed.

In the cell region, the nitride film 106 partially remains on the semiconductor substrate 100. The first and second interlayer insulating films 108 and 112 are stripped by a dry etch process and the nitride film 106 is stripped by a wet etch process.

Figure 1D:
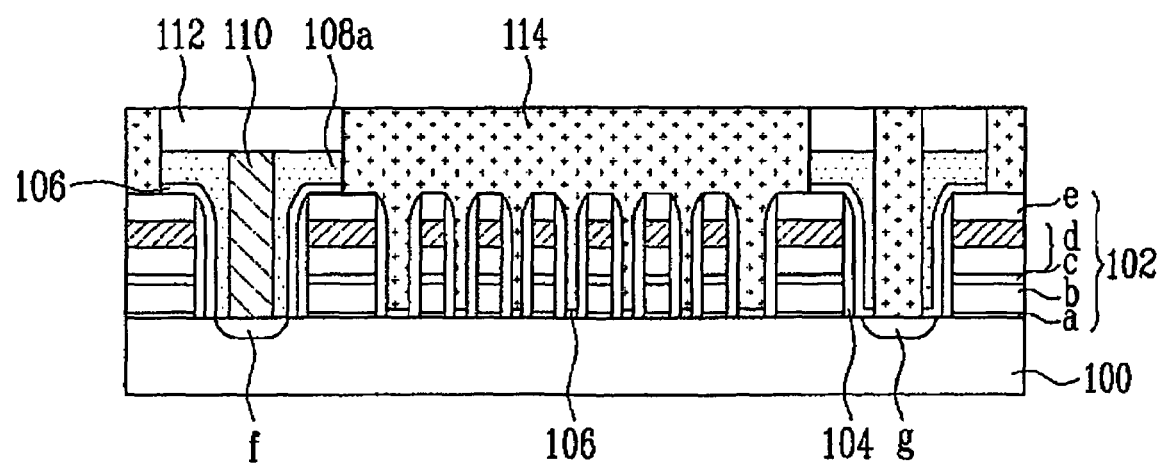

Referring to FIG. 1D, a polysilicon layer 114 is formed on the entire structure such that the region in which the drain contact will be formed and between-the cell gate 102 and the cell gate 102 is buried. The polysilicon layer 114 is polished until a top surface of the second interlayer insulating film 112 is exposed.

As the polysilicon layer 114 is formed between the cell gates 102, the capacitance between the cell gates 102 can be reduced and the interference phenomenon between the gates 102 can be reduced accordingly.

As described above, according to the invention, the polysilicon layer is formed between the cell gates. Accordingly, the invention is advantageous in that it can reduce the inter-gate capacitance and can improve the inter-gate interference phenomenon.

While the invention has been described in connection with practical exemplary embodiments, the invention is not limited to the disclosed embodiments but, to the contrary, is intended to cover various modifications and equivalent arrangements included within the spirit and scope of the appended claims.

What is claimed is:

1. A method of manufacturing a flash memory device, the method comprising the steps of:

forming a gate on a semiconductor substrate in which a cell region, a source selection line region, and a drain selection line region are defined and then forming spacers on sidewalls of the gate;

depositing a nitride film and a first interlayer insulating film on the entire structure, etching a region of the first interlayer insulating film to form a source contact hole, forming a conductive film on the entire structure to bury the source contact hole, and polishing the conductive film;

forming a second interlayer insulating film on the entire structure, and then etching the second and first interlayer insulating films and the nitride film using a mask through which regions in which a cell region and a drain contact will be formed are opened; and forming a polysilicon layer on the entire structure.

2. The method of claim 1, comprising when the nitride film is etched, the nitride film of the cell region is not all etched, but partially remains on the semiconductor substrate.

3. The method of claim 1, wherein the conductive film is a tungsten film.

* * * * *